(12) United States Patent
Hiroi et al.

(10) Patent No.: US 8,361,695 B2
(45) Date of Patent: Jan. 29, 2013

(54) RESIST UNDERLAYER FILM FORMING COMPOSITION AND METHOD FOR FORMING RESIST PATTERN

(75) Inventors: Yoshiomi Hiroi, Toyama (JP); Tomohisa Ishida, Toyama (JP); Takafumi Endo, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 312 days.

(21) Appl. No.: 12/747,039

(22) PCT Filed: Dec. 9, 2008

(86) PCT No.: PCT/JP2008/072334
§ 371 (c)(1),
(2), (4) Date: Jun. 9, 2010

(87) PCT Pub. No.: WO2009/075265
PCT Pub. Date: Jun. 18, 2009

(65) Prior Publication Data
US 2010/0266951 A1 Oct. 21, 2010

(30) Foreign Application Priority Data

Dec. 13, 2007 (JP) .................. 2007-321555
Jul. 2, 2008 (JP) .................. 2008-173721

(51) Int. Cl.
*G03F 7/004* (2006.01)
*G03F 7/30* (2006.01)

(52) U.S. Cl. .................. 430/271.1; 430/270.1; 430/326; 430/510; 430/512

(58) Field of Classification Search ............... 430/270.1, 430/271.1, 326, 510, 512
See application file for complete search history.

(56) References Cited

U.S. PATENT DOCUMENTS

| | | | |
|---|---|---|---|
| 7,842,620 B2 * | 11/2010 | Takei et al. | .................. 438/761 |
| 2004/0048196 A1 | 3/2004 | Shao et al. | |
| 2006/0014106 A1 | 1/2006 | Hatakeyama et al. | |
| 2006/0057491 A1 | 3/2006 | Wayton et al. | |
| 2006/0234156 A1 * | 10/2006 | Kishioka | .................. 430/270.1 |
| 2008/0038678 A1 | 2/2008 | Kishioka et al. | |
| 2010/0022089 A1 * | 1/2010 | Takei et al. | .................. 438/703 |

FOREIGN PATENT DOCUMENTS

| | | |
|---|---|---|
| CN | 1704455 A | 12/2005 |
| EP | 1 811 342 A1 | 7/2007 |
| JP | A-2000-313779 | 11/2000 |
| JP | A-2001-027810 | 1/2001 |
| JP | A-2003-531252 | 10/2003 |
| JP | A-2004-533637 | 11/2004 |
| JP | A-2005-346051 | 12/2005 |
| JP | A-2006-053543 | 2/2006 |
| JP | A-2006-126301 | 5/2006 |
| WO | WO 01/81010 A1 | 11/2001 |
| WO | WO 02/83415 A1 | 10/2002 |
| WO | WO 2005/098542 A1 | 10/2005 |
| WO | WO 2006/030320 A2 | 3/2006 |
| WO | WO 2006/040921 A1 | 4/2006 |
| WO | WO 2007/046453 A1 | 4/2007 |

OTHER PUBLICATIONS

International Search Report issued in International Application No. PCT/JP2008/072334 mailed on Jan. 20, 2009.
Chinese Office Action dated Nov. 25, 2011 issued in Chinese Patent Application No. 200880118921.0 (with translation).

* cited by examiner

*Primary Examiner* — John Chu
(74) *Attorney, Agent, or Firm* — Oliff & Berridge, PLC

(57) ABSTRACT

There is provided a composition for forming a resist underlayer film having a large selection ratio of dry etching rate, exhibiting desired values of the k value and the refractive index n at a short wavelength, for example, in an ArF excimer laser, and further, exhibiting solvent resistance. A resist underlayer film forming composition for lithography comprises a linear polymer having, in a main chain thereof, at least one of an aromatic ring-containing structure and a nitrogen atom-containing structure; and a solvent, wherein to the aromatic ring or the nitrogen atom, at least one alkoxyalkyl group or hydroxyalkyl group is directly bonded.

13 Claims, 1 Drawing Sheet

(A)
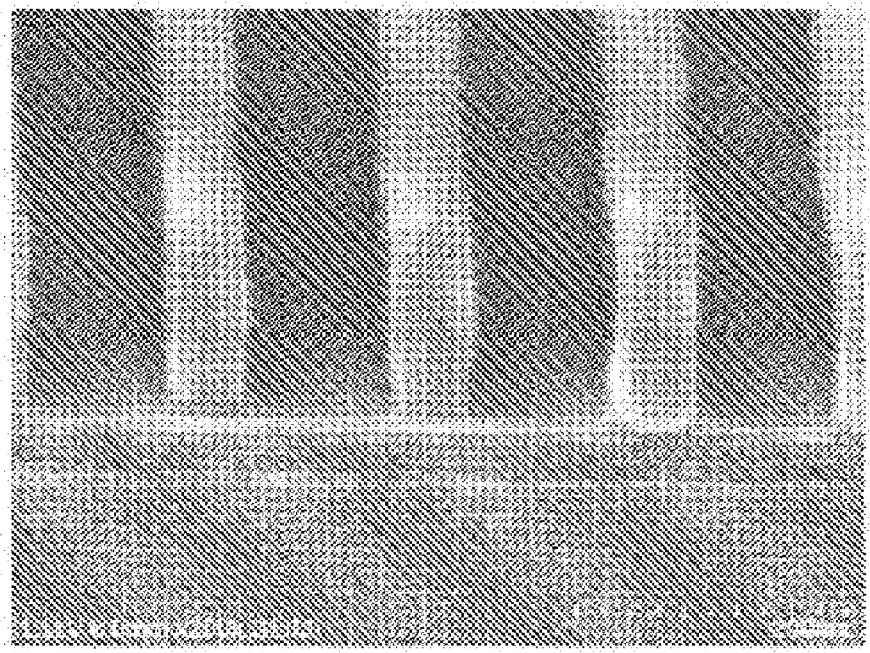
(B)
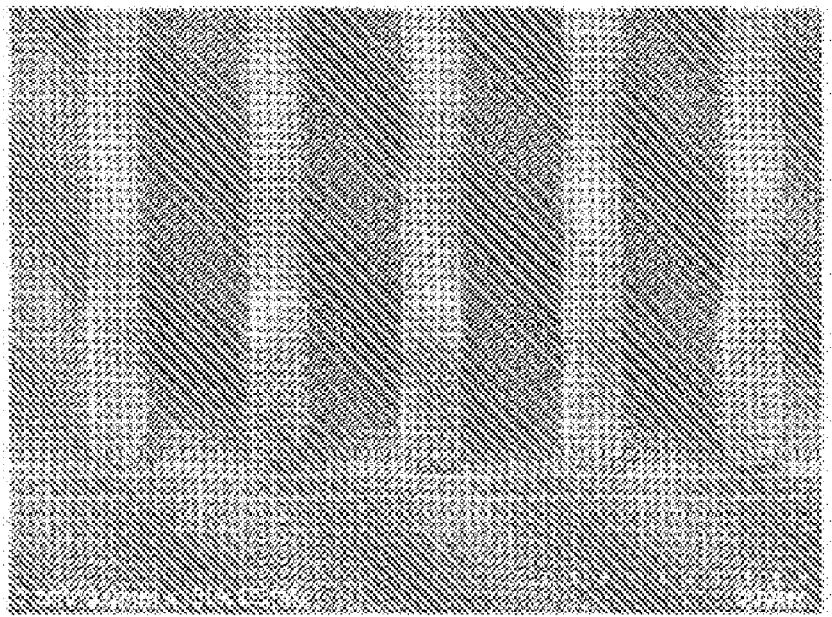

RESIST UNDERLAYER FILM FORMING COMPOSITION AND METHOD FOR FORMING RESIST PATTERN

TECHNICAL FIELD

The present invention relates to a composition useful for forming a resist underlayer film between a substrate and a resist film formed on the substrate in order to obtain a resist pattern having a desired shape in a lithography process which is a process for producing a semiconductor device. When a resist underlayer film suppresses the influence of a reflected wave on a resist film during the exposure of the resist film, the resist underlayer film can be called an antireflective film.

BACKGROUND ART

A composition for forming an antireflective film used in a lithography process is known (see Patent Document 1 to Patent Document 4). Patent Document 1 discloses a composition containing a copolymer having a structure unit derived from a benzene nucleus-containing vinyl monomer such as styrene and a structure unit derived from a (meth)acrylamide derivative. The composition is used particularly in a lithography process using an ArF excimer laser as a light source.

Patent Document 2 discloses a composition for forming an antireflective film, containing a copolymer having a structure unit derived from an anthracene nucleus-containing (meth)acrylic acid ester monomer instead of the above structure unit derived from a benzene nucleus-containing vinyl monomer.

Patent Document 3 discloses a composition for forming an antireflective containing a polymer formed using an alkoxyalkyl melamine or an alkoxyalkylbenzoguanamine and having structure units coupled with each other through a crosslinking group bonded to a nitrogen atom, such as —$CH_2$— and —$CH_2OCH_2$—.

Patent Document 4 discloses a composition for forming an antireflective film, containing a polymer obtained through a reaction between at least one glycoluril compound and at least one compound containing at least one hydroxyl group and/or an acid.

However, in Patent Document 1 and Patent Document 2, there is no description of a polymer having in the main chain, at least any one of an aromatic ring-containing structure and a nitrogen atom-containing structure. The polymers disclosed in Patent Document 3 and Patent Document 4 are not considered to be a linear polymer.

Patent Document 1: Japanese Patent Application Publication No, JP-A-2000-313779
Patent Document 2 Japanese Patent Application Publication No. JP-A-2001-027810
Patent Document 3: Japanese Translation of PCT International Application No. JP-A-2003-531252
Patent Document 4: International Publication No. WO 2006/030320 pamphlet

DISCLOSURE OF THE INVENTION

Problem to be Solved by the Invention

It is required that the resist underlayer film can be easily formed by applying a liquid resist underlayer film forming composition and curing the composition. Accordingly, the composition needs to be easily cured by heating or the like and to contain a compound (polymer) having a high solubility in a predetermined solvent. On the contrary, a resist underlayer film obtained from the composition is required to be insoluble in a resist solvent.

Further, the resist underlayer film is required to have a dry etching rate larger (a selection ratio of dry etching rate larger) than that of a resist pattern. However, resist underlayer films formed from the acrylic resin-containing compositions as described in Patent Document 1 and Patent Document 2 do not necessarily have a satisfactory dry etching rate. This is considered because a carbon-carbon bond (C—C bond) constituting the main chain of an acrylic resin is not easily broken by the dry etching in comparison with a carbon-oxygen bond (C—O bond).

It is an object of the present invention to provide a composition for forming a resist underlayer film having a large selection ratio of dry etching rate, exhibiting desired values of the k value and the refractive index n at a short wavelength, for example, in an ArF excimer laser (wavelength: about 193 nm), and further, exhibiting solvent resistance. It is another object of the present invention to provide a composition for forming a resist underlayer film that allows a resist pattern on the resist underlayer film to have a desired shape.

Means for Solving the Problem

A first aspect of the present invention is a resist underlayer film forming composition for lithography characterized by containing a linear polymer having, in a main chain thereof, at least one of an aromatic ring-containing structure and a nitrogen atom-containing structure, and a solvent, in which to the aromatic ring or the nitrogen atom, at least one alkoxyalkyl group or hydroxyalkyl group is directly bonded. The linear polymer does not necessarily mean a polymer in a straight line form. Instead of the expression of linear polymer, an expression of two-dimensional polymer can be also used.

In the resist underlayer film forming composition of the present invention, the linear polymer has, in the main chain thereof, a structure of Formula (1), Formula (2), or Formula (3):

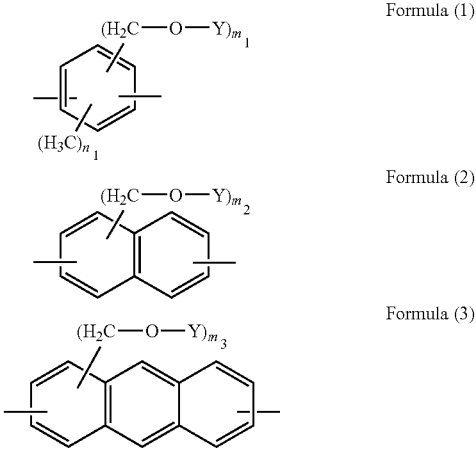

(where $m_1$ is an integer of 1 to 4, $n_1$ is an integer of 0 to 3, and $m_1+n_1$ satisfies an equation: $1 \leq (m_1+n_1) \leq 4$, $m_2$ is an integer of 1 to 6, $m_3$ is an integer of 1 to 8, and each Y is independently a $C_{1-10}$ alkyl group or a hydrogen atom).

In the resist underlayer film forming composition of the present invention, the linear polymer has, in the main chain thereof, a structure of Formula (4):

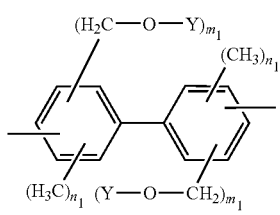
Formula (4)

(where each $m_1$ is independently an integer of 1 to 4, each $n_1$ is independently an integer of 0 to 3, and $m_1+n_1$ satisfies an equation: $1 \leq (m_1+n_1) \leq 4$, and each Y is independently a $C_{1-10}$ alkyl group or a hydrogen atom) instead of the structure of Formula (1), Formula (2), or Formula (3). The linear polymer may also have the structure of Formula (4) together with the structure of Formula (1), Formula (2), or Formula (3).

In the resist underlayer film forming composition of the present invention, the linear polymer has, in the main chain thereof, a structure of Formula (5):

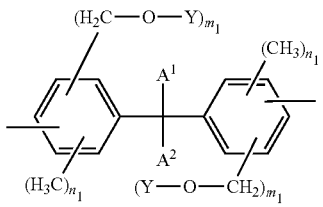
Formula (5)

(where each $m_1$ is independently an integer of 1 to 4, each $n_1$ is independently an integer of 0 to 3, and $m_1+n_1$ satisfies an equation: $1 \leq (m_1+n_1) \leq 4$, each Y is independently a $C_{1-10}$ alkyl group or a hydrogen atom, and $A^1$ and $A^2$ are independently a hydrogen atom, a $C_{1-4}$ alkyl group, or —$CF_3$) instead of the structure of Formula (1), Formula (2), Formula (3), or Formula (4). The linear polymer may also have the structure of Formula (5) together with the structure of Formula (1), Formula (2), Formula (3), or Formula (4).

In the resist underlayer film forming composition of the present invention, the linear polymer has, in the main chain thereof, a structure of Formula (6):

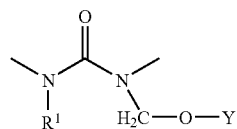
Formula (6)

(where $R^1$ is a $C_{1-6}$ alkyl group, a $C_{1-6}$ alkoxy group, a $C_{3-6}$ alkenyl group, a halogen atom, a nitro group, a cyano group, a hydroxy group, a $C_{1-6}$ alkylthio group, or a substituent of —$CH_2$—O—Y, and each Y is independently a $C_{1-10}$ alkyl group or a hydrogen atom) instead of the structure of Formula (1), Formula (2), Formula (3), Formula (4), or Formula (5). The linear polymer may also have the structure of Formula (6) together with the structure of Formula (1), Formula (2), Formula (3), Formula (4), or Formula (5).

The linear polymer has a structure of Formula (7), Formula (8), Formula (9), Formula (10), Formula (11), or Formula (12);

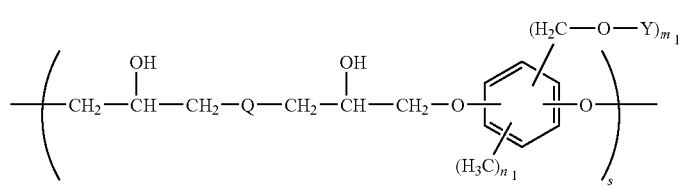
Formula (7)

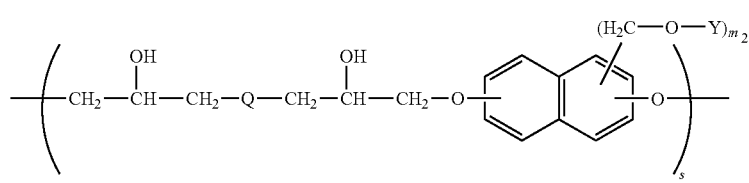
Formula (8)

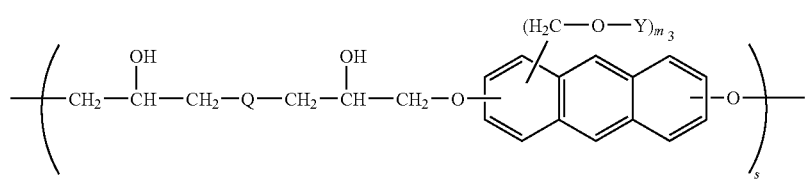
Formula (9)

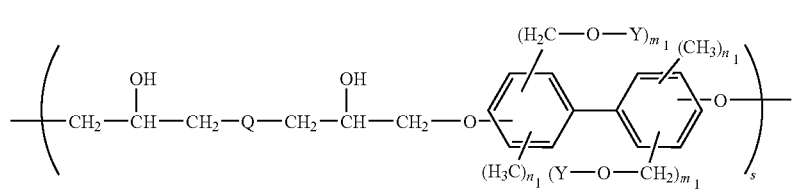
Formula (10)

Formula (11)

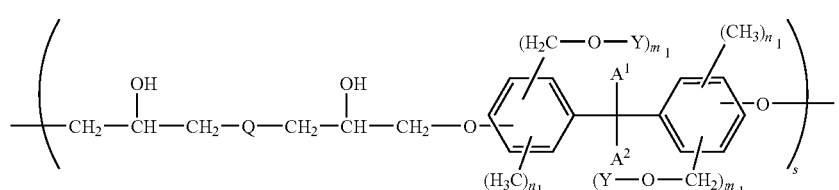

Formula (12)

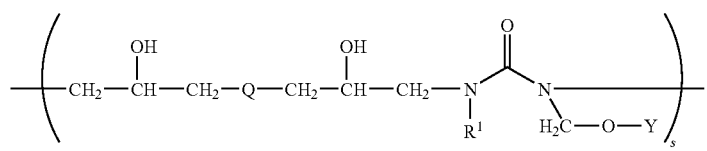

(where each s is independently the number of repeating units of 3 to 1,000, each $m_1$ is independently an integer of 1 to 4, each $n_1$ is independently an integer of 0 to 3, and $m_1+n_1$ satisfies an equation: $1 \leq (m_1+n_1) \leq 4$, $m_2$ is an integer of 1 to 6, $m_3$ is an integer of 1 to 8, $A^1$ and $A^2$ are independently a hydrogen atom, a $C_{1-4}$ alkyl group, or —$CF_3$, $R^1$ is a $C_{1-6}$ alkyl group, a $C_{1-6}$ alkoxy group, a $C_{3-6}$ alkenyl group, a halogen atom, a nitro group, a cyano group, a hydroxy group, a $C_{1-6}$ alkylthio group or a substituent of —$CH_2$—O—Y, each Y is independently a $C_{1-10}$ alkyl group or a hydrogen atom, and each Q is independently Formula (13), Formula (14), Formula (15), Formula (16), Formula (17), or Formula (18):

Formula (13)

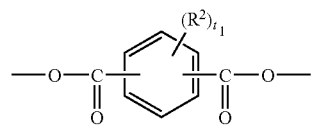

Formula (14)

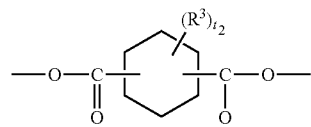

Formula (15)

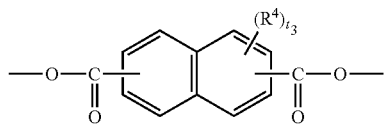

Formula (16)

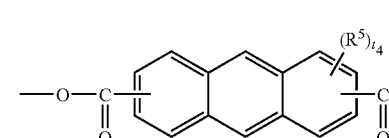

Formula (17)

—O—$(CH_2)_k$—O—

Formula (18)

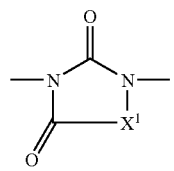

[where $R^2$, $R^3$, $R^4$, and $R^5$ are independently a $C_{1-6}$ alkyl group, a $C_{1-6}$ alkoxy group, a $C_{3-6}$ alkenyl group, a halogen atom, a nitro group, a cyano group, a hydroxy group, or a $C_{1-6}$ alkylthio group, $t_1$ is an integer of 0 to 4, $t_2$ is an integer of 0 to 10, $t_3$ is an integer of 0 to 6, $t_4$ is an integer of 0 to 8, k is an integer of 1 to 10, and $X^1$ is Formula (19), Formula (20), or Formula (21):

Formula (19)

Formula (20)

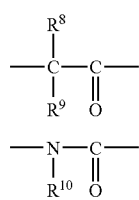

Formula (21)

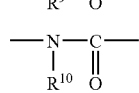

(where $R^6$, $R^7$, $R^8$, $R^9$, and $R^{10}$ are independently a hydrogen atom, a $C_{1-6}$ alkyl group, a $C_{3-6}$ alkenyl group, a benzyl group, or a phenyl group, where the phenyl group may be substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group, $R^6$ and $R^7$ may be bonded to each other to form a $C_{3-6}$ ring, and $R^8$ and $R^9$ may be bonded to each other to form a $C_{3-6}$ ring)]}.

The linear polymer may have besides a structure of Formula (10) {where s is the number of repeating units of 3 to 1,000, each $m_1$ is independently an integer of 1 to 4, each $n_1$ is independently an integer of 0 to 3, and $m_1+n_1$ satisfies an equation: $1 \leq (m_1+n_1) \leq 4$, each Y is independently a $C_{1-10}$ alkyl group or a hydrogen atom, Q is Formula (18) [where $X^1$ is Formula (21) (where $R^{10}$ is a hydrogen atom, a $C_{1-6}$ alkyl group, a $C_{3-6}$ alkenyl group, a benzyl group, or a phenyl group, where the phenyl group may be substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group)]}, a structure of Formula (22):

Formula (22)

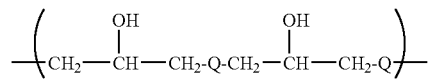

{where each Q is independently Formula (18) [where $X^1$ is Formula (21) (where $R^{10}$ is a hydrogen atom, a $C_{1-6}$ alkyl group, a $C_{3-6}$ alkenyl group, a benzyl group, or a phenyl group, where the phenyl group may be substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group)]}.

The alkoxyalkyl group, the hydroxyalkyl group, the alkyl group, the alkenyl group, the alkoxy group, and the alkylthio group described in the present specification are not limited to a straight chain group and may be in a branched structure or a cyclic structure. Examples of the halogen atom include a fluorine atom, a chlorine atom, a bromine atom, and an iodine atom.

The solvent contained in the resist underlayer film forming composition of the present invention contains at least one type selected from, for example propylene glycol monomethyl ether (PGME), propylene glycol monomethyl ether acetate (PGMEA), propylene glycol monopropyl ether, methyl ethyl ketone, ethyl lactate, cyclohexanone, γ-butyrolactone, and N-methylpyrrolidone.

When a component of the resist underlayer film forming composition remaining after subtracting the solvent from the whole composition is defined as the solid content, the solid content contains a linear polymer and an additive blended in the composition if necessary. The existence of a solid additive having a molecular mass smaller than that of the linear polymer becomes a cause of a sublimate generated during the formation of a resist underlayer film by a thermal curing, so that the amount of the additive should be limited to the minimum. When the additive is not contained in the composition, the ratio of the linear polymer in the solid content may be 100% by mass. The ratio of the solid content contained in the resist underlayer film forming composition of the present invention is, for example 0.1% by mass or more and 30% by mass or less, based on the mass of the resist underlayer film forming composition. The linear polymer in the solid content may be contained not as a main component, but as an additive (such as a crosslinker).

The resist underlayer film forming composition of the present invention may further contain a crosslinker as an additive. The crosslinker to be added is, for example a nitrogen-containing compound having 2 to 4 nitrogen atoms to which a methylol group or an alkoxymethyl group is bonded and the content of the crosslinker is, for example 0% by mass or more and 70% by mass or less, based on the mass of the polymer contained in the resist underlayer film forming composition of the present invention. 0% by mass means that the additive is not contained. Specific examples of the crosslinker include hexamethoxymethyl melamine, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea.

The resist underlayer film forming composition of the present invention may further contain a compound exhibiting acidity and/or a thermoacid generator as an additive. The compound exhibiting acidity and/or the thermoacid generator have(has) an action of accelerating a crosslinking reaction. Examples of the compound exhibiting acidity include sulfonic acid compounds and specific examples of the sulfonic acid compound include p-phenolsulfonic acid, p-toluenesulfonic acid, trifluoromethanesulfonic acid, pyridinium-p-toluenesulfonic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, and pyridinium-1-naphthalenesulfonic acid. Specific examples of the thermoacid generator include 4-acetoxyphenyldimethylsulfonium hexafluoroarsenate, benzyl-4-hydroxyphenylmethylsulfonium hexafluoroantimonate, 4-acetoxyphenylbenzylmethylsulfonium hexafluoroantimonate, dibenzyl-4-hydroxyphenylsulfonium hexafluoroantimonate, 4-acetoxyphenylbenzylsulfonium hexafluoroantimonate, 3-benzylbenzothiazolium hexafluoroantimonate, 2,4,4,6-tetrabromocyclohexadienone, benzointosylate, and 2-nitrobenzyltosylate. The content(s) of the acidity-exhibiting compound and/or the thermoacid generator are(is), for example 0% by mass or more and 20% by mass or less, based on the mass of the polymer contained in the resist underlayer film forming composition of the present invention. The thermoacid generator may be also a compound acting as a photoacid generator and instead of the thermoacid generator, the photoacid generator may be also used as an additive.

The resist underlayer film forming composition of the present invention may further contain a surfactant as an additive. The surfactant is an additive for enhancing the applicability of the composition on the substrate. As the surfactant, publicly known surfactants such as nonion-based surfactants and fluorinated surfactants may be used and the content of the surfactant is, for example 0% by mass or more and 10% by mass or less, based on the mass of the polymer contained in the resist underlayer film forming composition of the present invention.

The resist underlayer film forming composition of the present invention may further contain bisphenol S as an additive. Bisphenol S exhibits an effect of providing a resist pattern formed on the resist underlayer film in a desired shape. Specifically, the cross section of a resist pattern in a direction perpendicular to the substrate is unlikely to have a tapered shape and is likely to have a rectangular shape. The content of bisphenol S is, for example 0% by mass or more and 10% by mass or less, based on the mass of the polymer contained in the resist underlayer film forming composition of the present invention.

A second aspect of the present invention is a forming method of a resist pattern used in production of a semiconductor device including: a process for applying the resist underlayer film forming composition of the present invention on a semiconductor substrate and heating the composition to form a resist underlayer film; a process for forming a resist layer on the resist underlayer film; a process for exposing the semiconductor substrate coated with the resist underlayer film and the resist layer to light; and a process for developing the resist layer after the exposure.

The exposure performed in the second aspect of the present invention uses an ArF excimer laser. Instead of the ArF excimer laser, EUV (wavelength: 13.5 nm) or an electron beam may be also used. The "EUV" is an abbreviation of the extreme ultraviolet. The resist for forming the resist layer may be any one of a positive resist and a negative resist and as the resist, there can be used a chemical amplification-type resist sensitive to an ArF excimer laser, EUV or an electron beam.

A representative semiconductor substrate used in the second aspect of the present invention is a silicon wafer, however, as the semiconductor substrate, an SOI (Silicon on Insulator) substrate or a wafer of a compound semiconductor such as gallium arsenide (GaAs), indium phosphide (InP), and gallium phosphide (GaP) may be also used. On the semiconductor substrate, there may be also formed a film to be processed, for example a crystalline silicon film, an amorphous silicon film, and an insulating film such as a silicon oxide film, a nitrogen-containing silicon oxide film (SiON film), a carbon-containing silicon oxide film (SiOC film), and a fluorine-containing silicon oxide film (SiOF film), and in this case, the resist underlayer film is formed on the film to be processed.

Effects of the Invention

The polymer contained in the resist underlayer film forming composition of the present invention is a linear polymer and does not have a three-dimensional structure, so that the polymer is excellent in the solubility in a solvent. Moreover, the linear polymer has at least one alkoxyalkyl group or at least one hydroxyalkyl group per repeating unit and the alkoxyalkyl group or the hydroxyalkyl group contains a crosslinking point, so that the linear polymer can be cured by self-crosslinking through heating or the like even without using a crosslinker. After the curing, the polymer becomes a polymer in a three-dimensional structure, so that the solvent resistance of the polymer becomes higher.

On a resist underlayer film formed from the resist underlayer film forming composition of the present invention, a resist pattern in a desired shape (having a rectangular cross section in a direction perpendicular to the substrate) can be formed.

BEST MODES FOR CARRYING OUT THE INVENTION

The linear polymer contained in the resist underlayer film forming composition of the present invention is a product of a reaction between a first compound having two epoxy groups and a second compound having two epoxy reaction points (such as an OH group) and at least one alkoxyalkyl group or hydroxyalkyl group. The epoxy groups of the first compound react with the epoxy reaction points of the second compound to produce a linear polymer. The linear polymer has one or more and, for example four or less alkoxyalkyl group(s) or hydroxyalkyl group(s) per repeating unit. As the alkoxyalkyl group, an alkoxymethyl group is preferred in terms of self-crosslinkability and as the hydroxyalkyl group, a hydroxymethyl group is preferred in terms of self-crosslinkability.

The linear polymer contained in the resist underlayer film forming composition of the present invention may be a product of a reaction between three types of compounds by using besides the first compound and the second compound, a third compound that allows production of a linear polymer by reacting with the first compound.

Specific examples of the first compound having two epoxy groups are shown as follows. However, the specific examples are not limited to these compounds.

Formula (23)

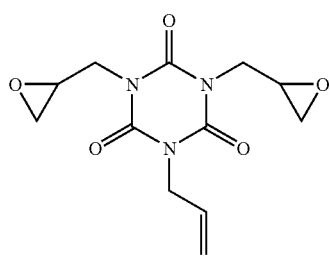

Formula (24)

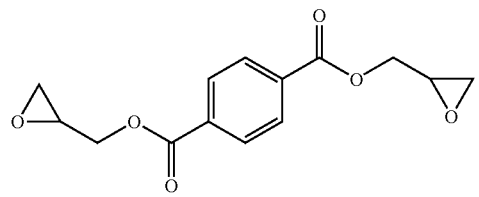

Formula (25)

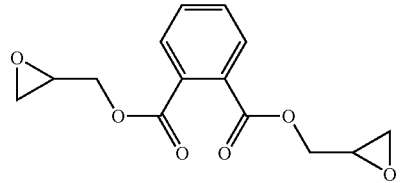

Formula (26)

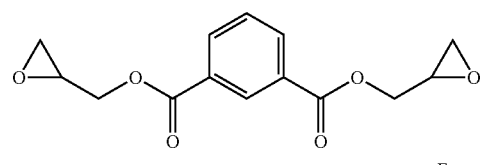

Formula (27)

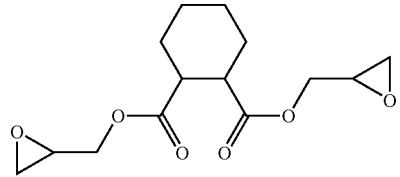

Formula (28)

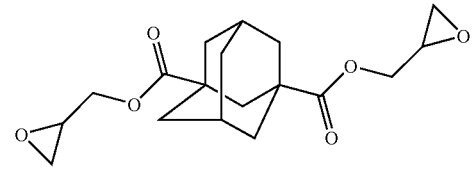

Formula (29)

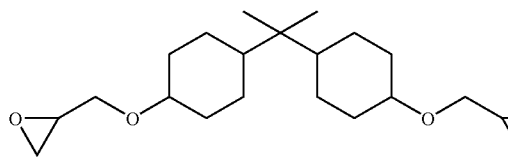

Formula (30)

Formula (31)

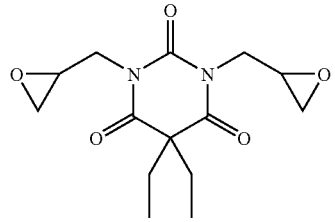

Formula (32)

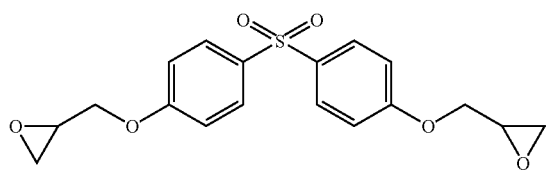

Further, specific examples of the second compound having two epoxy reaction points and at least one alkoxyalkyl group or hydroxyalkyl group are shown as follows, however, the specific examples are not limited to these compounds. In Formula (34), Formula (35), Formula (37), Formula (39), and Formula (41), "Me" is a methyl group.

Formula (33)

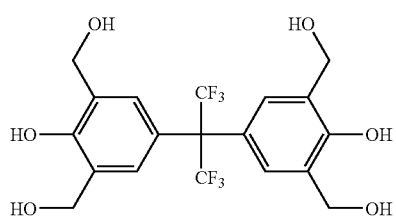

Formula (34)

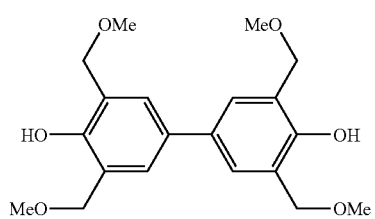

Formula (35)

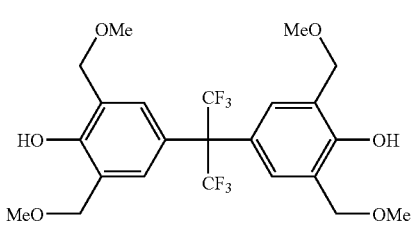

Formula (36)

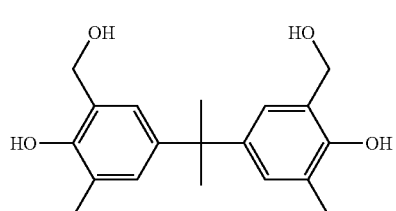

Formula (37)

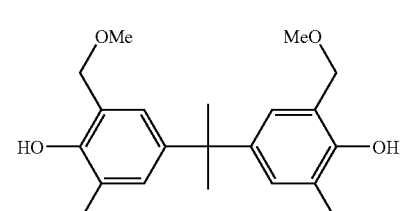

Formula (38)

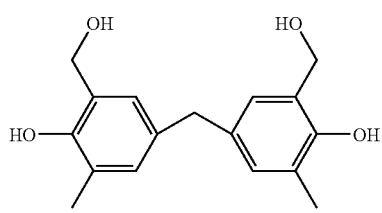

Formula (39)

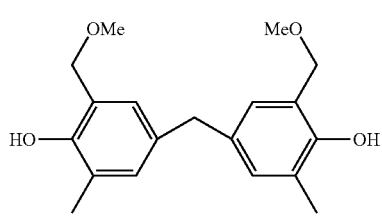

Formula (40)

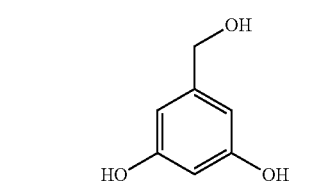

Formula (41)

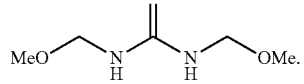

Hereinafter, the present invention will be described more specifically. However, the following Synthesis Examples and Examples should not be construed as limiting the scope of the present invention.

The average molecular mass of polymers shown in the present specification is the result of the measurement by gel permeation chromatography (hereinafter, abbreviated as GPC). For the measurement, a GPC apparatus (manufactured by Tosoh Corporation) was used and the conditions for the measurement were as follows.
GPC column: Shodex (registered trademark), Asahipak (registered trademark) (manufactured by Showa Denko K.K.)
Column temperature: 40° C.
Solvent: N,N-dimethylformamide (DMF)
Flow rate: 0.6 ml/min
Standard sample: polystyrene (manufactured by Tosoh Corporation)

EXAMPLES

Synthesis Example 1

4.0 g of monoallyldiglycidylisocyanuric acid (manufactured by Shikoku Chemicals Corporation) of Formula (23), 6.6 g of 5,5'-[2,2,2-trifluoro-1-(trifluoromethyl)ethylidene]bis[2-hydroxy-1,3-benzenedimethanol] (manufactured by Honshu Chemical Industry Co., Ltd.; trade name: TML-BPAF-MF) of Formula (33) and 0.3 g of triphenylmonoethylphosphonium bromide, which is a quaternary phosphonium salt, as a catalyst were dissolved in 25.3 g of propylene glycol monomethyl ether and the resultant reaction solution was warmed to 120° C., followed by stirring the reaction solution in a nitrogen atmosphere for 4 hours. The obtained reaction product was diluted with 18.1 g of propylene glycol monomethyl ether to prepare a varnish solution and the varnish solution was subjected to a GPC analysis. As the result of the analysis, the reaction product was found to have a weight average molecular weight of about 39,300 in terms of standard polystyrene.

Synthesis Example 2

4.0 g of monoallyldiglycidylisocyanuric acid (manufactured by Shikoku Chemicals Corporation) of Formula (23), 5.2 g of 3,3',5,5'-tetrakis(methoxymethyl)-[1,1'-biphenyl]-4,4'-diol (manufactured by Honshu Chemical Industry Co., Ltd.; trade name: TMOM-BP) of Formula (34) and 0.3 g of triphenylmonoethylphosphonium bromide as a catalyst were dissolved in 22.1 g of propylene glycol monomethyl ether and the resultant reaction solution was warmed to 120° C., followed by stirring the reaction solution in a nitrogen atmosphere for 4 hours. The obtained reaction product was diluted with 15.8 g of propylene glycol monomethyl ether to prepare a varnish solution and the varnish solution was subjected to a GPC analysis. As the result of the analysis, the reaction product was found to have a weight average molecular weight of about 5,800 in terms of standard polystyrene.

Synthesis Example 3

5.0 g of monoallyldiglycidylisocyanuric acid (manufactured by Shikoku Chemicals Corporation) of Formula (23), 2.6 g of 3,5-dihydroxybenzyl alcohol (manufactured by Tokyo Chemical Industry Co., Ltd.) of Formula (40) and 0.3 g of triphenylmonoethylphosphonium bromide as a catalyst were dissolved in 18.4 g of propylene glycol monomethyl ether and the resultant reaction solution was warmed to 120° C., followed by stirring the reaction solution in a nitrogen atmosphere for 4 hours. The obtained reaction product was diluted with 13.2 g of propylene glycol monomethyl ether to prepare a varnish solution and the varnish solution was subjected to a GPC analysis. As the result of the analysis, the reaction product was found to have a weight average molecular weight of about 7,800 in terms of standard polystyrene.

Synthesis Example 4

4.0 g of 1,2-cyclohexanedicarboxylic acid diglycidyl ester (manufactured by Sakamoto Yakuhin Kogyo Co., Ltd.) of Formula (27), 6.0 g of 5,5'-[2,2,2-trifluoro-1-(trifluoromethyl)ethylidene]bis[2-hydroxy-1,3-benzenedimethanol] (manufactured by Honshu Chemical Industry Co., Ltd.; trade name: TML-BPAF-MF) of Formula (33) and 0.2 g of triphenylmonoethylphosphonium bromide as a catalyst were dissolved in 23.9 g of propylene glycol monomethyl ether and the resultant reaction solution was warmed to 120° C., followed by stirring the reaction solution in a nitrogen atmosphere for 4 hours. The obtained reaction product was diluted with 17.1 g of propylene glycol monomethyl ether to prepare a varnish solution and the varnish solution was subjected to a GPC analysis. As the result of the analysis, the reaction product was found to have a weight average molecular weight of about 30,600 in terms of standard polystyrene.

Synthesis Example 5

4.5 g of 1,2-cyclohexanedicarboxylic acid diglycidyl ester (manufactured by Sakamoto Yakuhin Kogyo Co., Ltd.) of Formula (27), 5.4 g of 3,3',5,5'-tetrakis(methoxymethyl)-[1,1'-biphenyl]-4,4'-diol (manufactured by Honshu Chemical Industry Co., Ltd.; trade name: TMOM-BP) of Formula (34) and 0.3 g of triphenylmonoethylphosphonium bromide as a catalyst were dissolved in 23.6 g of propylene glycol monomethyl ether and the resultant reaction solution was warmed to 120° C., followed by stirring the reaction solution in a nitrogen atmosphere for 4 hours. The obtained reaction product was diluted with 16.9 g of propylene glycol monomethyl ether to prepare a varnish solution and the varnish solution was subjected to a GPC analysis. As the result of the analysis, the reaction product was found to have a weight average molecular weight of about 3,700 in terms of standard polystyrene.

Synthesis Example 6

7.0 g of 1,2-cyclohexanedicarboxylic acid diglycidyl ester (manufactured by Sakamoto Yakuhin Kogyo Co., Ltd.) of Formula (27), 3.2 g of 3,5-dihydroxybenzyl alcohol (manufactured by Tokyo Chemical Industry Co., Ltd.) of Formula (40) and 0.4 g of triphenylmonoethylphosphonium bromide as a catalyst were dissolved in 24.8 g of propylene glycol monomethyl ether and the resultant reaction solution was warmed to 120° C., followed by stirring the reaction solution in a nitrogen atmosphere for 4 hours. The obtained reaction product was diluted with 17.8 g of propylene glycol monomethyl ether to prepare a varnish solution and the varnish solution was subjected to a GPC analysis. As the result of the analysis, the reaction product was found to have a weight average molecular weight of about 2,800 in terms of standard polystyrene.

Synthesis Example 7

5.0 g of monoallyldiglycidylisocyanuric acid (manufactured by Shikoku Chemicals Corporation) of Formula (23), 3.0 g of phthalic acid and 0.2 g of monophenyltriethylammonium chloride, which is a quaternary ammonium salt, as a catalyst were dissolved in 19.1 g of propylene glycol monomethyl ether and the resultant reaction solution was warmed to 120° C., followed by stirring the reaction solution in a nitrogen atmosphere for 24 hours. The obtained reaction product was subjected to a GPC analysis and as the result of the analysis, the reaction product was found to have a weight average molecular weight of about 8,900 in terms of standard polystyrene. The present Synthesis Example differs from other Synthesis Examples of the present specification in terms that the second compound, that is, a compound having two epoxy reaction points and at least one alkoxyalkyl group or hydroxyalkyl group is not used.

Synthesis Example 8

60.0 g of monoallyldiglycidylisocyanuric acid (manufactured by Shikoku Chemicals Corporation) of Formula (23), 31.15 g of monoallylisocyanuric acid (manufactured by Shikoku Chemicals Corporation) of Formula (42) below, 11.78 g of 3,3',5,5'-tetrakis(nethoxymethyl)-[1,1'-biphenyl]-4,4'-diol (manufactured by Honshu Chemical Industry Co., Ltd.; trade name: TMOM-BP) of Formula (34) and 2.47 g of monophenyltriethylammonium chloride, which is a quaternary ammonium salt, as a catalyst were dissolved in 158.09 g of propylene glycol monomethyl ether and the resultant reaction solution was warmed to 120° C., followed by stirring the reaction solution in a nitrogen atmosphere for 4 hours. The obtained reaction product was diluted with 263.48 g of propylene glycol monomethyl ether to prepare a varnish solution and the varnish solution was subjected to a GPC analysis. As the result of the analysis, the reaction product was found to have a weight average molecular weight of about 7,700 in terms of standard polystyrene.

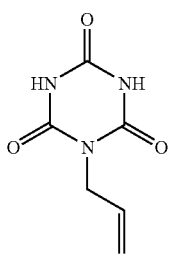

Formula (42)

The reaction product obtained in the present Synthesis Example has, together with a unit structure of Formula (10') below corresponding to Formula (10), a unit structure of Formula (43) below,

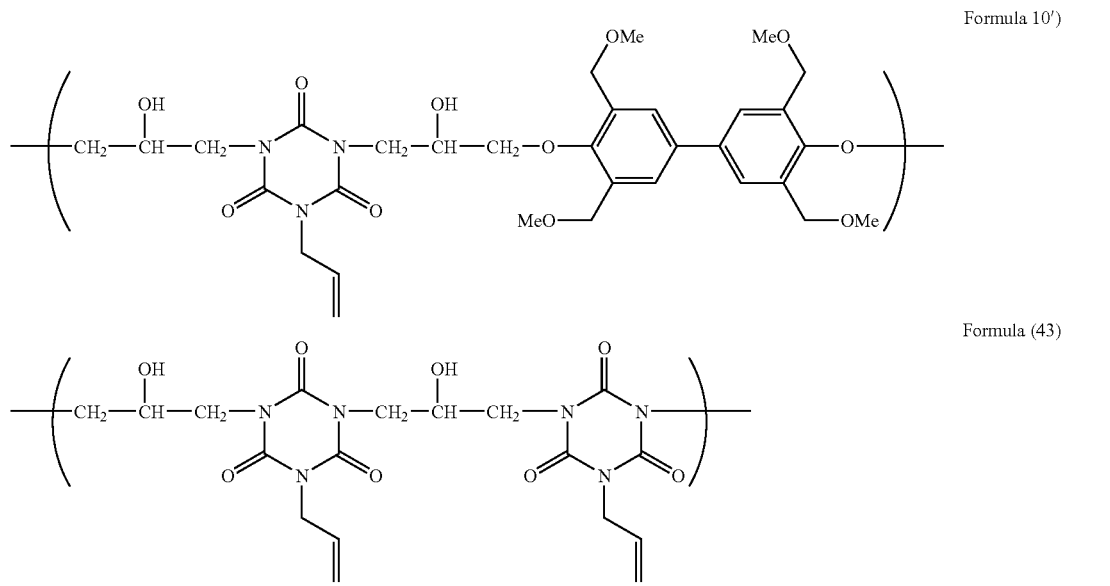

Formula 10')

Formula (43)

Example 1

To 10 g of a solution containing 2 g of the polymer obtained in Synthesis Example 1 of the present specification, 0.05 g of 5-sulfosalicylic acid, 23 g of propylene glycol monomethyl ether and 31 g of propylene glycol monomethyl ether acetate were added to prepare a solution. Subsequently, the solution was filtered using a polyethylene microfilter having a pore diameter of 0.10 μm and was further filtered using a polyethylene microfilter having a pore diameter of 0.05 μm to prepare a resist underlayer film forming composition (solution).

Example 2

The same process as in Example 1 was carried out, except that the polymer obtained in Synthesis Example 2 was used instead of the polymer obtained in Synthesis Example 1 described in the present specification.

Example 3

The same process as in Example 1 was carried out, except that the polymer obtained in Synthesis Example 3 was used instead of the polymer obtained in Synthesis Example 1 described in the present specification.

Example 4

The same process as in Example 1 was carried out, except that the polymer obtained in Synthesis Example 4 was used instead of the polymer obtained in Synthesis Example 1 described in the present specification.

Example 5

The same process as in Example 1 was carried out, except that the polymer obtained in Synthesis Example 5 was used instead of the polymer obtained in Synthesis Example 1 described in the present specification.

Example 6

The same process as in Example 1 was carried out, except that the polymer obtained in Synthesis Example 6 was used instead of the polymer obtained in Synthesis Example 1 described in the present specification.

Example 7

The same process as in Example 1 was carried out, except that the polymer obtained in Synthesis Example 8 was used instead of the polymer obtained in Synthesis Example 1 described in the present specification.

Example 8

To 1.589 g of a solution containing 0.271 g of the polymer obtained in Synthesis Example 8 of the present specification, 25.358 g of propylene glycol monomethyl ether, 2.964 g of propylene glycol monomethyl ether acetate, 0.068 g of tetramethoxymethylglycoluril (manufactured by Nihon Cytec Industries Inc.; trade name: POWDERLINK (registered trademark) 1174), 0.007 g of p-phenolsulfonic acid (manufactured by Tokyo Chemical Industry Co., Ltd.), 0.005 g of a surfactant (manufactured by DIC Corporation; trade name MEGAFAC R-30) and 0.009 g of bisphenol S (manufactured by Tokyo Chemical Industry Co., Ltd.) were added to prepare a solution. Subsequently, the solution was filtered using a polyethylene microfilter having a pore diameter of 0.10 μm to prepare a resist underlayer film forming composition.

Comparative Example 1

The same process as in Example 1 was carried out, except that the polymer obtained in Synthesis Example 7 was used instead of the polymer obtained in Synthesis Example 1 described in the present specification.
(Dissolution Test in Photoresist Solvent)

Each of the resist underlayer film forming compositions prepared in Example 1 to Example 8 and Comparative Example 1 described in the present specification was applied on a silicon wafer using a spinner. The composition was heated on a hot plate at 205° C. for 1 minute to form a resist underlayer film. The resist underlayer film was immersed in a solvent (ethyl lactate) used for the photoresist to perform a test for confirming whether the resist underlayer film was insoluble or not in the solvent. The result of the evaluation is shown in Table 1.

TABLE 1

| | Solvent resistance (unit of film thickness: μm) | | |
|---|---|---|---|
| | Initial film thickness | Film thickness after immersion | Loss of film thickness |
| Example 1 | 0.15 | 0.15 | 0.00 |
| Example 2 | 0.14 | 0.14 | 0.00 |
| Example 3 | 0.14 | 0.14 | 0.00 |
| Example 4 | 0.14 | 0.14 | 0.00 |
| Example 5 | 0.19 | 0.19 | 0.00 |
| Example 6 | 0.18 | 0.18 | 0.00 |
| Example 7 | 0.03 | 0.03 | 0.00 |
| Example 8 | 0.03 | 0.03 | 0.00 |
| Comparative Example 1 | 0.14 | 0.08 | 0.06 |

(Test for Optical Parameter)

Each of the resist underlayer film forming compositions prepared in Example 1 to Example 8 and Comparative Example 1 described in the present specification was applied on a silicon wafer using a spinner. The composition was heated on a hot plate at 240° C. for 1 minute to form a resist underlayer film (film thickness: 0.06 μm). Then, the refractive index (n value) and the attenuation coefficient (k value) at the wavelength of 193 nm of the resist underlayer film were measured using a spectroscopic ellipsometer (manufactured by J.A. Woollam Co., Inc.; VUV-VASE VU-302). The result of the evaluation is shown in Table 2.
(Measurement of Dry Etching Rate)

Each of the resist underlayer film forming compositions prepared in Example 1 to Example 8 and Comparative Example 1 described in the present specification was applied on a silicon wafer using a spinner. The composition was heated on a hot plate at 205° C. for 1 minute to form a resist underlayer film. Then, the dry etching rate (the amount of decrease in film thickness per unit time) of the resist underlayer film was measured using RIE system ES401 (manufactured by Nippon Scientific Co., Ltd.) under a condition of using $CF_4$ as a dry etching gas.

In the same manner as described above, a photoresist solution (manufactured by Sumitomo Chemical Co., Ltd.; trade name: PAR710) was applied on a silicon wafer using a spinner and the solution was heated on a hot plate at 90° C. for 1 minute to form a photoresist layer. Then, the dry etching rate of the photoresist layer was measured using RIE system ES401 (manufactured by Nippon Scientific Co., Ltd) under a condition of using $CF_4$ as a dry etching gas.

Comparison was made between the dry etching rate of the photoresist PAR 710 (manufactured by Sumitomo Chemical Co., Ltd.) with the dry etching rates of the resist underlayer films obtained from the resist underlayer film forming compositions prepared in Example 1 to Example 8 and Comparative Example 1. The dry etching rate of each of the resist underlayer films obtained from the resist underlayer film forming compositions of Examples and Comparative Example when assuming the dry etching rate of the photoresist PAR 710 as 1.00 is shown as the "selection ratio" in Table 2.

TABLE 2

| | n value | k value | Selection ratio |
|---|---|---|---|
| Example 1 | 1.47 | 0.43 | 1.35 |
| Example 2 | 1.66 | 0.32 | 1.15 |
| Example 3 | 1.68 | 0.45 | 1.28 |
| Example 4 | 1.41 | 0.34 | 1.24 |
| Example 5 | 1.56 | 0.16 | 1.12 |
| Example 6 | 1.51 | 0.18 | 1.17 |
| Example 7 | 2.01 | 0.39 | 1.87 |
| Example 8 | 1.99 | 0.40 | 1.93 |
| Comparative Example 1 | 1.80 | 0.32 | 1.79 |

From the results shown in Table 2, it was found that the resist underlayer film obtained from the resist underlayer film forming composition of the present invention has a satisfactorily effective refractive index and attenuation coefficient relative to a light of wavelength 193 nm. In Example 7 and Example 8, a high n value (about 2.0) was obtained. It was also found that the resist underlayer film obtained from the resist underlayer film forming composition of the present invention has a large selection ratio of dry etching rate relative to a photoresist. Therefore, it can be said that the time required for removing the resist underlayer film by dry etching can be reduced, and thus, it is possible to suppress an undesired phenomenon that the film thickness of the photoresist layer decreases with the removal of the resist underlayer film by dry etching.

On the contrary, the results shown in Table 1 mean that only the resist underlayer film obtained from the composition prepared in Comparative Example 1 of the present specification does not have solvent resistance. In other words, it became apparent that the resist underlayer film causes mixing with a resist solvent, so that the composition prepared in Comparative Example 1 is not suitable for a resist underlayer film forming composition.
(Evaluation of Photoresist Pattern Shape)

Each of the resist underlayer film forming compositions prepared in Example 1 to Example 3 of the present specification was applied on a silicon wafer by a spinner. The composition was heated at 205° C. for 1 minute to form a resist underlayer film having a film thickness of 50 to 80 nm. The resist underlayer film was coated with a commercially available positive photoresist solution (manufactured by JSR Corporation; trade name: AR2772JN) by a spinner and the resultant coating was heated at 130° C. for 90 seconds on a hot plate to form a photoresist film (film thickness: 0.25 μm).

Next, using PAS5500/1100 scanner (manufactured by ASML Holding N.Y.; wavelength: 193 nm, NA: 0.75, σ: 0.89/0.55 (ANNULAR)), the exposure was performed through a mask which is set such that nine lines of the photoresist having a line width of 0.08 μm and a line pitch of 0.08 μm, that is, having 0.08 μmL/S (dense line) are formed after the development. Subsequently, the film was subjected to the heating after the exposure at 130° C. for 90 seconds on a hot plate, and was cooled down. Then the film was subjected to the development through a single paddle-type process for 60 seconds according to the industrial standards, using a 0.26 N tetramethylanunonium hydroxide aqueous solution as a developer.

A cross section of the obtained photoresist pattern in the direction perpendicular to the substrate (silicon wafer) was observed under a scanning electron microscope (SEM). As the result of the observation, it was found that a cross section of each of the obtained photoresist patterns had an advantageous shape in which the bottom thereof was straight, that is, a substantially rectangular shape. SEM images obtained by photographing a cross section of the photoresist patterns that are formed by the above-described method using the resist underlayer film forming compositions of Example 1 and Example 3 are shown in FIGS. 1A and 1B, respectively.

BRIEF DESCRIPTION OF THE DRAWINGS

FIG. 1A is an SEM image obtained by photographing a cross section of the photoresist pattern that is formed by the above-described method using the resist underlayer film forming composition of Example 1. FIG. 1B is an SEM image obtained by photographing a cross section of the photoresist pattern that is formed by the above-described method using the resist underlayer film forming composition of Example 3.

The invention claimed is:

1. A resist underlayer film forming composition for lithography comprising:
    a linear polymer having, in a main chain thereof, at least one of an aromatic ring-containing structure and a nitrogen atom-containing structure; and
    a solvent, wherein
    to the aromatic ring or the nitrogen atom, at least one alkoxyalkyl group or hydroxyalkyl group is directly bonded.

2. The resist underlayer film forming composition for lithography according to claim 1, wherein the linear polymer has, in the main chain thereof, a structure of Formula (1), Formula (2), or Formula (3):

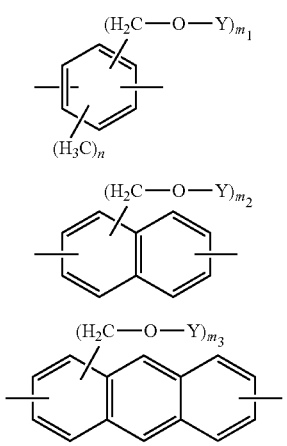

Formula (1)

Formula (2)

Formula (3)

(where $m_1$ is an integer of 1 to 4, $n_1$ is an integer of 0 to 3, and $m_1+n_1$ satisfies an equation: $1 \leq (m_1+n_1) \leq 4$, $m_2$ is an integer of 1 to 6, $m_3$ is an integer of 1 to 8, and each Y is independently a $C_{1-10}$ alkyl group or a hydrogen atom).

3. The resist underlayer film forming composition for lithography according to claim 1, wherein the linear polymer has, in the main chain thereof, a structure of Formula (4):

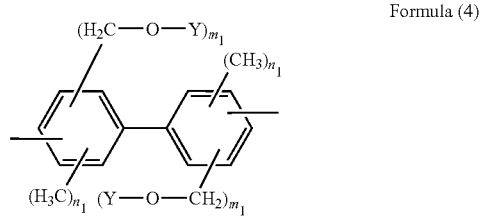

Formula (4)

(where each $m_1$ is independently an integer of 1 to 4, each $n_1$ is independently an integer of 0 to 3, and $m_1+n_1$ satisfies an equation: $1 \leq (m_1+n_1) \leq 4$, and each Y is independently a $C_{1-10}$ alkyl group or a hydrogen atom).

4. The resist underlayer film forming composition for lithography according to claim 1, wherein the linear polymer has, in the main chain thereof, a structure of Formula (5):

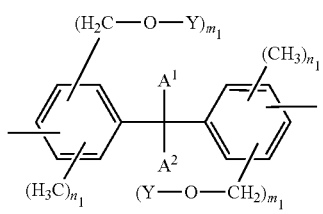

Formula (5)

(where each $m_1$ is independently an integer of 1 to 4, each $n_1$ is independently an integer of 0 to 3, and $m_1+n_1$ satisfies an equation: $1 \leq (m_1+n_1) \leq 4$, each Y is independently a $C_{1-10}$ alkyl group or a hydrogen atom, and $A^1$ and $A^2$ are independently a hydrogen atom, a $C_{1-4}$ alkyl group, or —$CF_3$).

5. The resist underlayer film forming composition for lithography according to claim 1, wherein the linear polymer has, in the main chain thereof, a structure of Formula (6):

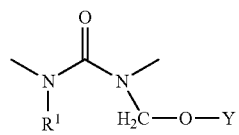

Formula (6)

(where $R^1$ is a $C_{1-6}$ alkyl group, a $C_{1-6}$ alkoxy group, a $C_{3-6}$ alkenyl group, a halogen atom, a nitro group, a cyano group, a hydroxy group, a $C_{1-6}$ alkylthio group, or a substituent of —$CH_2$—O—Y, and each Y is independently a $C_{1-10}$ alkyl group or a hydrogen atom).

6. The resist underlayer film forming composition for lithography according to claim 1, wherein the linear polymer has a structure of Formula (7), Formula (8), Formula (9), Formula (10), Formula (11), or Formula (12):

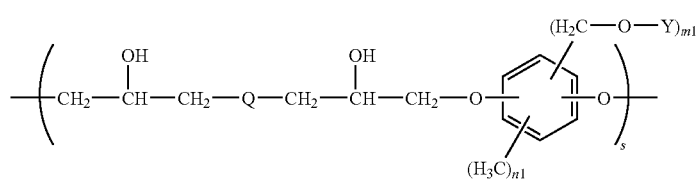

Formula (7)

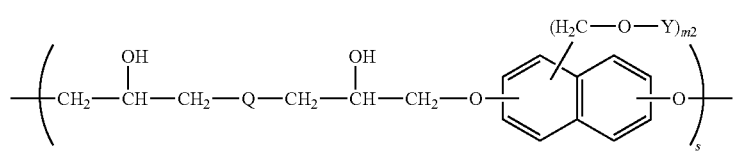

Formula (8)

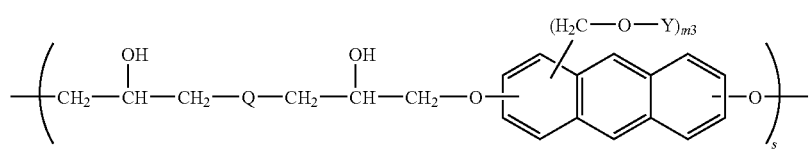

Formula (9)

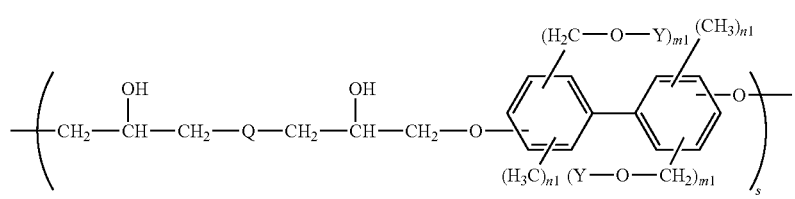

Formula (10)

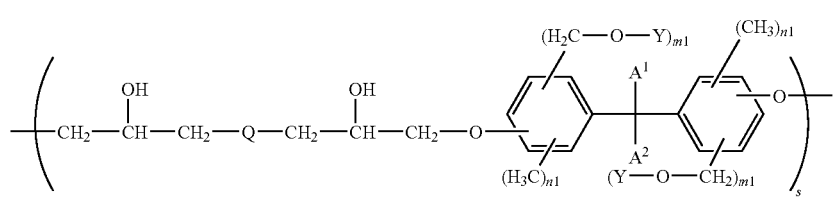

Formula (11)

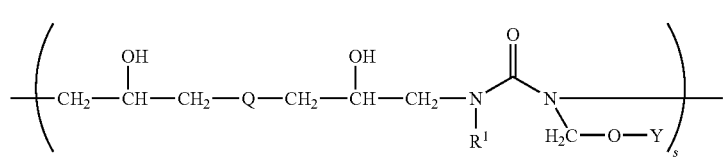

Formula (12)

{where each s is independently the number of repeating units of 3 to 1,000, each $m_1$ is independently an integer of 1 to 4, each $n_1$ is independently an integer of 0 to 3, and $m_1+n_1$ satisfies an equation: $1 \leqq (m_1+n_1) \leqq 4$, $m_2$ is an integer of 1 to 6, $m_3$ is an integer of 1 to 8, $A^1$ and $A^2$ are independently a hydrogen atom, a $C_{1-4}$ alkyl group, or —$CF_3$, $R^1$ is a $C_{1-6}$ alkyl group, a $C_{1-6}$ alkoxy group, a $C_{3-6}$ alkenyl group, a halogen atom, a nitro group, a cyano group, a hydroxy group, a $C_{1-6}$ alkylthio group or a substituent of —$CH_2$—O—Y, each Y is independently a $C_{1-10}$ alkyl group or a hydrogen atom, and each Q is independently Formula (13), Formula (14), Formula (15), Formula (16), Formula (17), or Formula (18):

Formula (13)

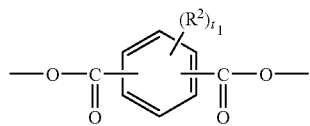

-continued

Formula (14)

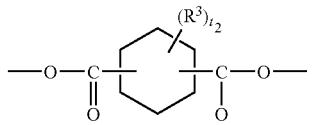

Formula (15)

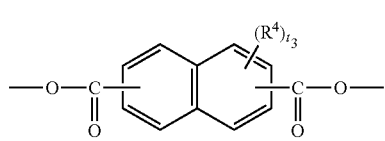

Formula (16)

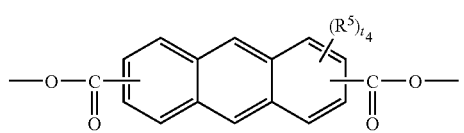

Formula (17)

—O—$(CH)_k$—O—

Formula (18)

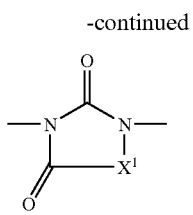

[where $R^2$, $R^3$, $R^4$, and $R^5$ are independently a $C_{1-6}$ alkyl group, a $C_{1-6}$ alkoxy group, a $C_{3-6}$ alkenyl group, a halogen atom, a nitro group, a cyano group, a hydroxy group, or a $C_{1-6}$ alkylthio group, $t_1$ is an integer 0 to 4, $t_2$ is an integer of 0 to 10, $t_3$ is an integer of 0 to 6, $t_4$ is an integer of 0 to 8, k is an integer of 1 to 10, and $X^1$ is Formula (19), Formula (20), or Formula (21):

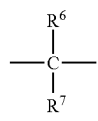

Formula (19)

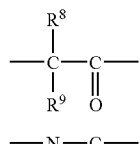

Formula (20)

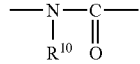

Formula (21)

(where $R^6$, $R^7$, $R^8$, $R^9$, and $R^{10}$ are independently a hydrogen atom, a $C_{1-6}$ alkyl group, a $C_{3-6}$ alkenyl group, a benzyl group, or a phenyl group, where the phenyl group is optionally substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group, $R^6$ and $R^7$ are optionally bonded to each other to form a $C_{3-6}$ ring, and $R^8$ and $R^9$ are optionally bonded to each other to form a $C_{3-6}$ ring)]}.

7. The resist underlayer film forming composition for lithography according to claim 6, wherein the linear polymer has a structure of Formula (10) {where s is the number of repeating units of 3 to 1,000, each $m_1$ is independently an integer of 1 to 4, each $n_1$ is independently an integer of 0 to 3, and $m_1+n_1$ satisfies an equation: $1 \leq (m_1+n_1) \leq 4$, each Y is independently a $C_{1-10}$ alkyl group or a hydrogen atom, Q is Formula (18)

[where $X^1$ is Formula (21) (where $R^{10}$ is a hydrogen atom, a $C_{1-6}$ alkyl group, a $C_{3-6}$ alkenyl group, a benzyl group, or a phenyl group, where the phenyl group is optionally substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group)]} and a structure of Formula (22):

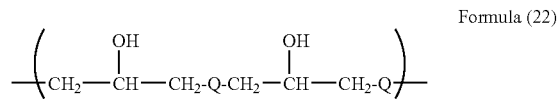

Formula (22)

{where each Q is independently Formula (18) [where $X^1$ is Formula (21) (where $R^{10}$ is a hydrogen atom, a $C_{1-6}$ alkyl group, a $C_{3-6}$ alkenyl group, a benzyl group, or a phenyl group, where the phenyl group is optionally substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group)]}.

8. The resist underlayer film forming composition for lithography according to claim 1, further comprising a crosslinker.

9. The resist underlayer film forming composition for lithography according to claim 1, further comprising a surfactant.

10. The resist underlayer film forming composition for lithography according to claim 1, further comprising a compound exhibiting acidity and/or a thermoacid generator.

11. The resist underlayer film forming composition for lithography according to claim 1, further comprising bisphenol S.

12. A forming method of a resist pattern used in production of a semiconductor device comprising:
applying the resist underlayer film forming composition for lithography as claimed in claim 1 on a semiconductor substrate and heating the composition to form a resist underlayer film;
forming a resist layer on the resist underlayer film;
exposing the semiconductor substrate coated with the resist underlayer film and the resist layer to light; and
developing the resist layer after the exposure.

13. The forming method of a resist pattern according to claim 12, wherein a semiconductor substrate in which a film to be processed is formed on a surface of the substrate is used, and the resist underlayer film is formed on the film to be processed.

* * * * *